(12) United States Patent
Meng et al.

(10) Patent No.: US 6,222,387 B1
(45) Date of Patent: Apr. 24, 2001

(54) OVERVOLTAGE TOLERANT INTEGRATED CIRCUIT INPUT/OUTPUT INTERFACE

(75) Inventors: Anita X. Meng, Milpitas, CA (US); Ronald Choi, Scarborough (CA)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/179,280

(22) Filed: Oct. 26, 1998

(51) Int. Cl.[7] .............................................. H03K 29/0175

(52) U.S. Cl. .................................. 326/83; 326/81; 326/80

(58) Field of Search ................................. 326/80, 81, 83, 326/82, 86

(56) References Cited

U.S. PATENT DOCUMENTS

| | | | |
|---|---|---|---|
| 5,909,140 | * | 6/1999 | Choi ...................................... 327/534 |
| 5,973,530 | * | 10/1999 | Morris et al. ......................... 327/210 |

OTHER PUBLICATIONS

Rhyne, Fundamentals of Digital Systems Design, pp 70–71, 1973.*

* cited by examiner

Primary Examiner—Michael Tokar
Assistant Examiner—Anh Tran
(74) Attorney, Agent, or Firm—Wagner, Murabito & Hao LLP

(57) ABSTRACT

An I/O interface circuit which is capable of tolerating the application of an overvoltage condition to a corresponding I/O pad but which also has a relatively low trip point voltage includes an overvoltage detection circuit configured to have a trip point at a first voltage provided by a voltage divider circuit. The voltage divider circuit may include a pair of transistors coupled in series between a voltage source having a second voltage and ground. In such cases, the first voltage may be approximately equal to the difference between the second voltage and a threshold voltage of one of the pair of transistors. Alternatively, the voltage divider circuit may include a NAND gate having an output coupled to the overvoltage detection circuit and an input coupled to receive a second voltage. The second voltage may be determined by a voltage at an I/O pad of the I/O interface and one or more diodes coupled between the I/O pad and the NAND gate.

7 Claims, 14 Drawing Sheets

US 6,222,387 B1

OVERVOLTAGE TOLERANT INTEGRATED CIRCUIT INPUT/OUTPUT INTERFACE

FIELD OF THE INVENTION

The present invention relates to an overvoltage tolerant buffer circuit which is suitable for driving an integrated circuit I/O (input/output) connection and, more particularly, to the overvoltage detection portion of the buffer circuit.

BACKGROUND

An increase in the number of fabrication processes available for manufacturing integrated circuits has lead to an increased diversity in operating conditions under which the integrated circuits perform. For example, the range of supply voltages, switching voltages, input and output voltages can vary as between integrated circuits fabricated by different processes. In order for an integrated circuit to be compatible with circuits manufactured using a different process, it may therefore be necessary for the integrated circuit to be tolerant of voltages on the I/O connections thereof which are different from voltages which may be received from a circuit manufactured using the same fabrication process.

One particular problem which has been encountered is the application of a voltage to an I/O connection which is higher that the supply voltage for the integrated circuit. This is referred to as an overvoltage condition at the I/O connection. For example, complimentary metal oxide semiconductor (CMOS) circuits can be manufactured to operate on a supply voltage (Vcc) of 3.3 volts (where the rail-to-rail voltage swing is 3.3 volts), while many other circuits utilize a 5 volt supply and can thus be expected to produce an output in the region of 5 volts. If a 3.3 volt CMOS circuit receives an input of 5 volts at an I/O connection thereof (an overvoltage condition), difficulties can be encountered within an input/output buffer circuit of the 3.3 volt CMOS circuit. In particular, an undesirable large leakage current from the I/O connection through the input/output buffer of the 3.3 volt CMOS circuit may arise as a result of the overvoltage condition. Additionally, latch up of the CMOS circuit can occur as a result of the overvoltage condition. Both of these phenomena are detrimental to the operation of the CMOS circuit and can, in extreme circumstances, result in destruction of the circuit.

To illustrate the dangers associated with overvoltage conditions, consider the simplified CMOS output buffer circuit 2 shown in FIG. 1. Output buffer 2 drives an I/O connection 4, such as a contact pad of an integrated circuit (IC), which contains the buffer 2, in accordance with signals received on control lines 6. As shown, output buffer 2 includes a PMOS pull-up transistor 8 which couples the I/O pad 4, by way of an output line 10, to a supply voltage line 12 (Vcc). An NMOS pull-down transistor 14 couples the I/O pad 4 to another supply voltage such as Vss or ground (GND). In operation, the pull-up and pull-down transistors 8, 14 are controlled by way of the control lines 6 so as to selectively couple the I/O pad 4 to the supply rail 12 or GND, which enables the output voltage to swing between GND (e.g., zero volts) and Vcc (the supply voltage, e.g., 3.3 volts). In order for the output buffer 2 to drive the I/O pad 4 all the way to the positive supply voltage Vcc, the pull-up transistor 8 must be a PMOS type transistor in order to avoid the undesirable voltage drop which would occur if an NMOS type transistor were used for this function.

In a CMOS fabrication process, the PMOS and NMOS transistors which make up the integrated circuit are typically fabricated in separate regions of the silicon substrate, the P-type transistors in an N-type region, and the N-type transistors in a P-type region. One way in which this is achieved is to dope the semiconductor wafer with a P-type majority carrier in which the N-type transistors can be formed, and to form discrete N-type "well", regions in which the P-type transistors are fabricated, which is referred to as an n-well CMOS process. Typically the n-well substrate regions are biased to the supply voltage of the integrated circuit, which promotes proper operation of the transistors formed therein.

An equivalent circuit 20 of the output buffer circuit is shown in FIG. 2, which illustrates the result of the application of an overvoltage to the I/O pad 4. An electrical apparatus 22 is shown connected to the output buffer 2 by way of the I/O pad 4. The apparatus 22 may, for example, be another integrated circuit which operates at a higher supply voltage (e.g., 5 volts) than the IC which contains output buffer 2. When the electrical apparatus 22 raises the potential of output line 10 above the supply voltage Vcc of the output buffer 2, the drain terminal of the pull-up transistor 8 is raised above the potential of both the gate terminal thereof and the substrate region in which the transistor is formed. This causes the PMOS pull-up transistor 8 to turn on, which creates a current path from the output line 10 to the supply line 12, and also causes the drain-substrate diode of the transistor 8 to be forward biased, creating another current path from the output line 10 to the Vcc supply line 12. These current paths are indicated by dashed lines (I) in FIG. 2. This situation, at best, stops the voltage at the I/O pad 4 from rising much above the Vcc supply voltage of the IC which contains output buffer 2, but can also cause CMOS latch-up in this IC because of the injected current.

A similar situation may occur during "hot", or "live insertion". In this case, the I/O connections of an integrated circuit device are assumed to be conditioned (i.e., non-zero voltage) before the power supply is connected thereto. Even though the voltage applied to the I/O connections may not be an overvoltage in the sense of being greater than the operating supply voltage of the device, the instantaneous voltage at the I/O connections is nevertheless greater than the voltage applied to the power supply line when power is connected (ramped) to the device. In this instance, a major concern is latch-up if excessive current is injected from the I/O connection.

Bud hold circuits may suffer from similar effects. For example, FIG. 3 shows a bus hold circuit 30 which includes a two-inverter latch. A bus hold circuit is designed to prevent a bus from floating to an undefined state when all of the devices connected to the bus are in a high impedance state. Without the use of such a circuit, the input buffers of devices connected to the bus could produce false transitions and may also dissipate unacceptably high currents. The bus hold circuit 30 includes a CMOS inverter 34 connected in a feedback path around another CMOS inverter 36. An input to CMOS inverter 36 is connected to I/O pad 4. CMOS inverter 34 includes a PMOS transistor 38 connected in series with an NMOS transistor 40, the source of the PMOS transistor 38 being connected to an on-chip supply voltage, e.g., a 3.3 volt supply (Vcc). In operation, the I/O pad 4 is driven by a bus and therefore the voltage which appears at I/O pad 4 will correspond to whatever voltage is on the bus (e.g., 5V). Bus hold circuit 30 is designed to allow the bus to drive the input of inverter 36 and hold its value of logic high or low at the output of inverter 36. When an I/O driver of the bus is then tri-stated, the bus hold inverter 34 will maintain the logic level of the bus, so that the bus state does not become undefined.

To sustain a bus hold, CMOS inverter 34 must be connected to I/O pad 4. If 5 volts is applied to a bus hold circuit operating from a 3.3 volt supply voltage (Vcc), a parasitic n-well diode (not shown, but similar to that described above) associated with the PMOS transistor 38 of CMOS inverter 34 becomes forward biased and injects current into Vcc. The n-well diode turns on when the pad voltage rises above Vcc. Furthermore, the PMOS transistor 38 turns on as its drain voltage rises above Vcc, causing an additional drain-source current to flow. In each case, the effect of the overvoltage on I/O pad 4 is to source current from a device driving the pad into Vcc. This will lead to a low transition on the bus and may damage the device driving the bus to 5 volts. The effect may be even worse during live insertion of a device 30 onto the bus, because there may be no voltage supply to the device when its first connected to the bus.

If an NMOS transistor were used in place of the PMOS transistor 38, the problem of current injection into the 3.3 volt supply could be avoided, however, an NMOS transistor connected to Vcc does not produce a sufficiently high voltage level on its output due to its threshold voltage (Vth). An NMOS transistor could be used if its gate voltage were raised to a voltage higher than the on-chip supply voltage (Vcc) by an amount which would overcome the threshold voltage and backbody effects, however, the circuitry required to produce such voltages tends to consume a great deal of power and is not suitable for use with low-power devices. Accordingly, a PMOS transistor must be used.

It is apparent from the forgoing discussion that it is desirable to provide an input/output buffer circuit which is capable of tolerating the application of an overvoltage condition to a corresponding I/O connection (e.g., a contact pad), and which is capable of supporting "live-insertion", whilst minimizing the extent of current injection from the I/O connection when the electrical potential thereat is greater than the potential of the power supply line of the buffer circuit. It is also desirable to provide such a buffer circuit using simple, n-well CMOS technology without necessarily requiring the use of bipolar technology and/or charge pumping circuits.

In order to minimize injected current from the I/O connection (e.g. a contact pad) of an integrated circuit semiconductor device, it has been found that regulation of a bias voltage applied to the region of the semiconductor substrate in which driving transistors of an input/output buffer associated with the I/O connection are fabricated can be utilized to ensure that the substrate bias potential is not substantially exceeded by the potential at the I/O connection. In a CMOS application where a PMOS pull-up transistor circuit is employed for the pull-up portion of the output buffer, this bias voltage regulation ensures that the drain to substrate junction diode formed by the pull-up transistor does not become forward biased so as to conduct injected current from the I/O connection to Vcc.

FIG. 4 is a block diagram of an exemplary overvoltage tolerant I/O interface 42 (e.g., an input/output buffer) for an integrated circuit. The I/O interface 42 includes an input buffer 44, having a bus hold circuit 46, and an output buffer 48, each of which is connected to a common I/O pad 4. A reference voltage generating circuit 50 and an n-well bias signal generating circuit 52 are also connected to the I/O pad 4 and control the operation of the input buffer 44 and output buffer 48. The signals Vref and NSUB generated by each of these circuits, respectively, are coupled to the gates and n-wells, respectively, of a number of PMOS transistors found within input buffer 44 and output buffer 48 to provide an overvoltage tolerant interface suitable for connection to a bus which may operate above the supply voltage (Vcc). Each of these signals is arranged to track whatever voltage appears at I/O pad 4.

FIG. 5 shows bus hold circuit 46 in more detail. In comparison with the conventional bus hold circuit 30 shown in FIG. 3, bus hold circuit 46 includes an inverter element 47 having an isolation transistor 54 in the form of a PMOS transistor coupled between the source of a second PMOS transistor 56 and the supply voltage (Vcc). The gate of isolation transistor 54 is controlled by the reference voltage signal Vref while the n-wells of each of the PMOS transistors 54, 56 of the bus hold circuit 46 are controlled by the n-well bias signal NSUB.

As shown in FIG. 6, voltage reference signal Vref remains at zero volts, provided the voltage at I/O pad 4 does not exceed the on-chip supply voltage Vcc. Under these conditions, the isolation transistor 54 remains on and therefore the inverter element 47 functions in the conventional manner. However, if the pad voltage rises above the on-chip supply voltage Vcc, the reference voltage signal Vref tracks the pad voltage to control the voltage at the gate of isolation transistor 54. This causes isolation transistor 54 to switch off, thereby isolating the second PMOS transistor 56 from the voltage source Vcc.

Accordingly, although the drain voltage of PMOS transistor 56 may rise well above Vcc, transistor 56 does not source current to Vcc.

As shown in FIG. 7, the n-well bias signal NSUB is held constant at a level substantially equal to Vcc, providing the pad voltage (Vpad) is at or below the on-chip supply voltage Vcc. If the pad voltage rises above Vcc, the n-well bias signal NSUB then tracks the pad voltage. This ensures that the parasitic n-well diodes in the PMOS transistors 54 and 56 of the inverter element 47 remain reversed biased, and therefore do not source current to Vcc.

The voltage reference signal Vref is supplied by the voltage reference signal generating circuit 50 shown in FIG. 8. This circuit is designed to (1) detect when the voltage at I/O pad 4 exceeds the on-chip supply voltage Vcc and, (2) provide the overvoltage input onto the gate of the isolation transistor 54 shown in FIG. 5. This ensures that the gate-source voltage (Vgs) of the isolation transistor 54 is zero and so prevents transistor 56 from turning on.

The voltage reference signal generating circuit 50 of FIG. 8 includes a concatenated series of inverters $I_1$, $I_2$ and $I_3$, each having a PMOS transistor connected in series with an NMOS transistor. The n-wells of each of these PMOS transistors are driven by the n-well bias signal NSUB described above, thus ensuring that the parasitic n-well diodes remain reversed biased and therefore do not source current to Vcc. The sources of each of the PMOS transistors of inverters $I_1$, $I_2$ and $I_3$ are connected to I/O pad 4. The gates of the transistors in inverter $I_1$ are tied to the voltage source Vcc. An output of the first inverter $I_1$ is fed via a further inverter $I_4$ in a feed forward circuit path 58 to an NMOS pull-down transistor 60 at the output of the circuit 50.

In operation, when the pad voltage is below the on-chip supply voltage Vcc, the PMOS transistor in inverter $I_1$ turns off, and the associated NMOS transistor turns on. This gives a low output at node $N_1$ which, once inverted by inverter $I_4$, causes NMOS transistor 60 to turn on, pulling the output at node $N_2$ of the circuit 50 (i.e., Vref) low. When the pad voltage rises above the on-chip supply voltage Vcc +Vtp (the trip point voltage) the PMOS transistor in inverter $I_1$ turns on so that the output at node $N_1$ is pulled up to the voltage at I/O pad 4. This voltage is then passed through the following inverter stages $I_2$ and $I_3$, and appears at node $N_2$ (Vref) at the output of the circuit 50. Accordingly, as shown in FIG. 6, when the pad voltage (Vpad) rises above Vcc +Vtp, the reference voltage Vref tracks the pad voltage. The concatenated series of inverters $I_1$, $I_2$ and $I_3$, act as buffers and so improve the edge rate of the Vref signal. The PMOS and NMOS transistors in inverter II are ratioed to control the trip point voltage at the output of I, (i.e., node N1). The NMOS transistor must be small (weak) enough to ensure that the PMOS transistor is able to charge $N_1$, to a logic high when the pad voltage is greater than the on-chip supply voltage Vcc. The concatenations of the buffers $I_1$, $I_2$ and $I_3$ is required to decouple the large load capacitance connected on node $N_2$ from the output of inverter $I_1$.

FIG. 9 shows a conventional n-well bias signal (NSUB) generating circuit 52 in more detail. As shown, circuit 52 includes a pair of PMOS transistors 62 and 64, connected in series between an on-chip supply rail Vcc and I/O pad 4. The gate of PMOS transistor 62 is connected to I/O pad 4 and so is controlled depending on whatever voltage appears at the pad. The gate of transistor 64 is connected to Vcc. As described above, when the pad voltage is at or below Vcc, the output of NSUB circuit 52 is held constant at a level substantially equal to Vcc. Should the pad voltage rise above Vcc+Vtp, the output NSUB tracks the pad voltage. The NSUB output signal is applied to a number of PMOS transistor components in the I/O interface 42, to bias the n-wells thereof. This keeps the parasitic diodes of the n-wells reversed biased so there is no current sourced to Vcc.

Thus, FIG. 10 is a detailed circuit diagram for I/O interface 42, showing the inverter element 47, voltage reference signal generating circuit 50 and NSUB generating circuit 52 described above coupled together. As shown, the voltage reference signal generating circuit 50 also generates a signal VrefB. Under normal conditions, this signal is at a voltage level substantially equal to the supply voltage Vcc. In an overvoltage condition, VrefB corresponds to the level of Vss (i.e., GND). As discussed above, when the I/O pad 4 is used as an input and its rail-to-rail voltage swing is less than or equal to Vcc, transistor 66 of inverter $I_1$ is off, the voltage at node $N_1$ is zero, VrefB is a logic 1 (i.e., Vcc, Vref is a logic 0 (i.e., GND)), transistor 62 is on and the n-well bias signal NSUB is substantially at Vcc. However, when the I/O pad 4 is used as an input and its rail-to-rail voltage awing is between 0 and 5 volts (or some on-chip Vcc+Vtp), transistor 66 turns on when Vpad is approximately equal to Vcc+Vtp, the voltage at node $N_1$ is a logic 1, VrefB is a logic 0, Vref is a logic 1. In addition, transistor 64 also turns on when Vpad is approximately equal to Vcc+Vtp, transistor 62 is off, so the n-well bias signal NSUB tracks Vpad.

Although this scheme provides an I/O interface circuit 42 which is capable of tolerating the application of an overvoltage condition to I/O pad 4, it has been found that the circuit sets a high trip point voltage (Vcc+Vtp), i.e., the point at which the n-well bias signal NSUB will begin to track the pad voltage, causing a current spike (on the order of 5 –11 mA) before the n-well bias signal generating circuit fully turns on 52. This may cause latch-up problems in some devices. Accordingly, what is needed is an I/O interface circuit which is capable of tolerating the application of an overvoltage condition to a corresponding I/O pad, but which also has a relatively low trip point voltage.

SUMMARY OF THE INVENTION

The present invention provides an I/O interface circuit which is capable of tolerating the application of an overvoltage condition to a corresponding I/O pad, but which also has a relatively low trip point voltage. In one embodiment, the overvoltage tolerant input/output (I/O) interface includes an overvoltage detection circuit configured to have a trip point at a first voltage provided by a voltage divider circuit. The voltage divider circuit may include a pair of transistors coupled in series between a voltage source having a second voltage and ground. In such cases, the first voltage may be approximately equal to the difference between the second voltage and a threshold voltage of one of the pair of transistors. Alternatively, the voltage divider circuit may include a NAND gate having an output coupled to the overvoltage detection circuit and an input coupled to receive a second voltage. The second voltage may be determined by a voltage at an I/O pad of the I/O interface and one or more diodes coupled between the I/O pad and the NAND gate.

Other features and advantages of the present invention will be apparent from the detailed description and its accompanying drawings which follow.

BRIEF DESCRIPTION OF THE DRAWINGS

The present invention is illustrated by way of example, and not limitation, in the figures of the accompanying drawings in which.

DETAILED DESCRIPTION

Figure 1:
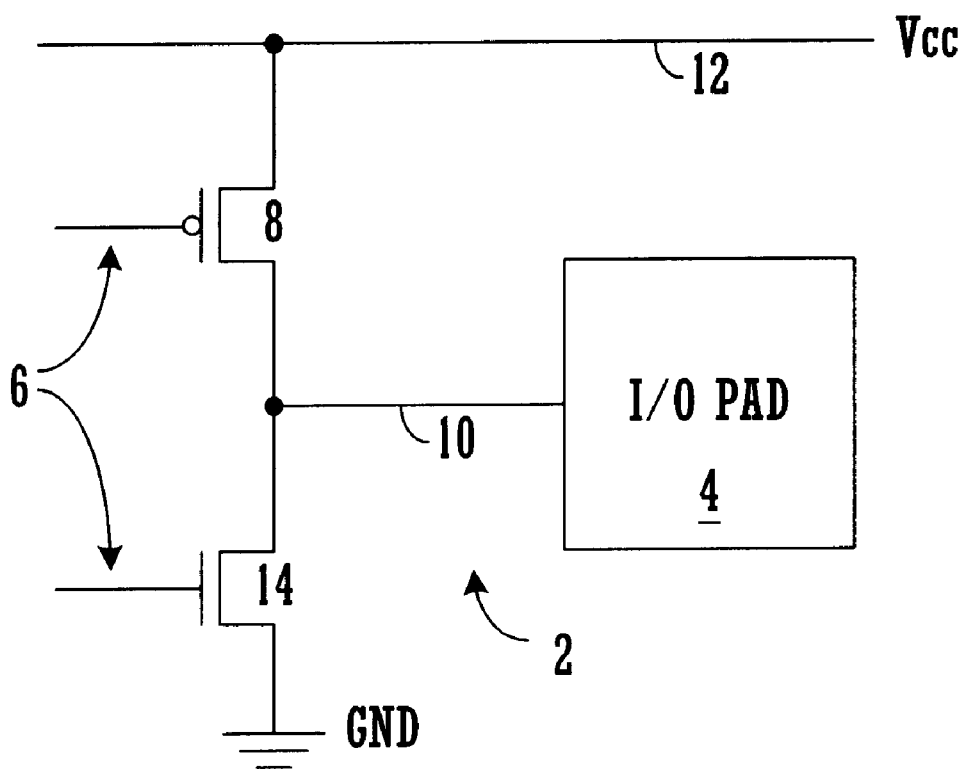
FIG. 1 illustrates a conventional CMOS output buffer.
Figure 2:
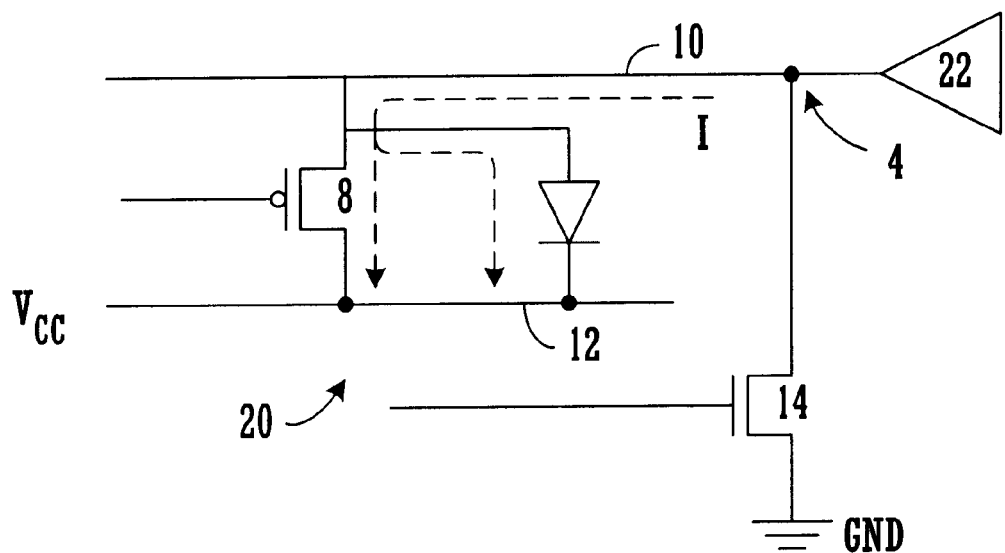
FIG. 2 is an equivalent circuit of the CMOS output buffer of FIG. 1 in the case where an overvoltage condition is applied at an input/output connection thereof.
Figure 3:
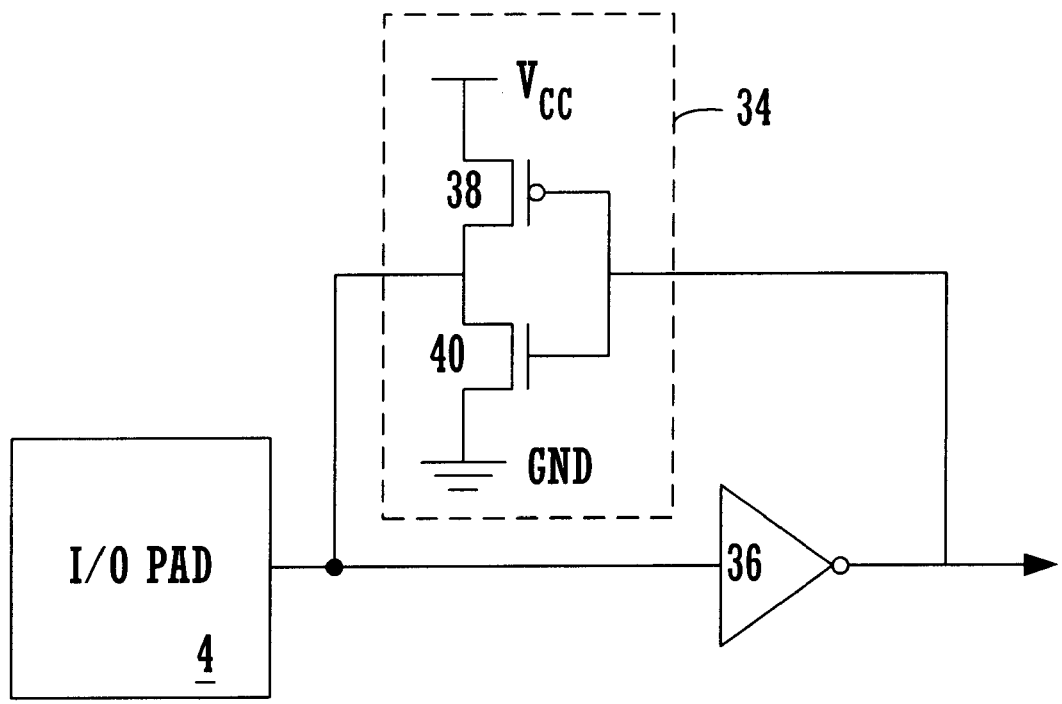
FIG. 3 illustrates a conventional CMOS bus hold circuit.
Figure 4:
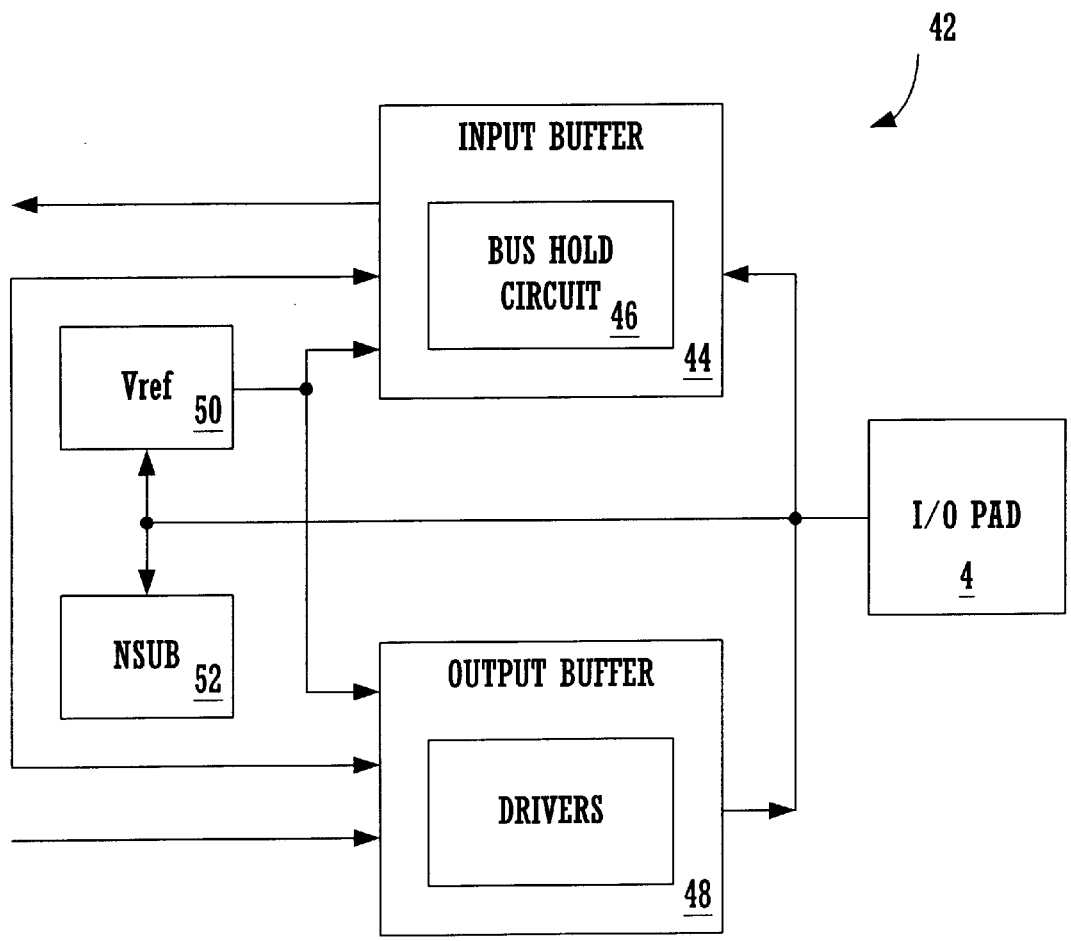
FIG. 4 illustrates a conventional overvoltage tolerant I/O interface for an integrated circuit.
Figure 5:
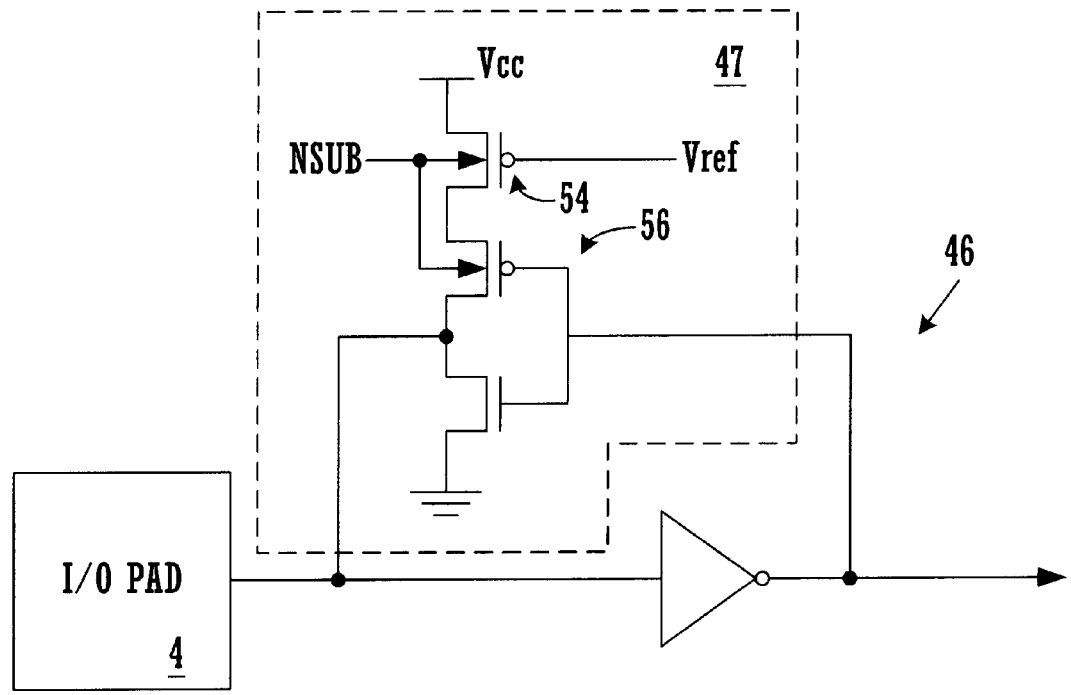
FIG. 5 illustrates a bus hold circuit with an isolation element.
Figure 6:
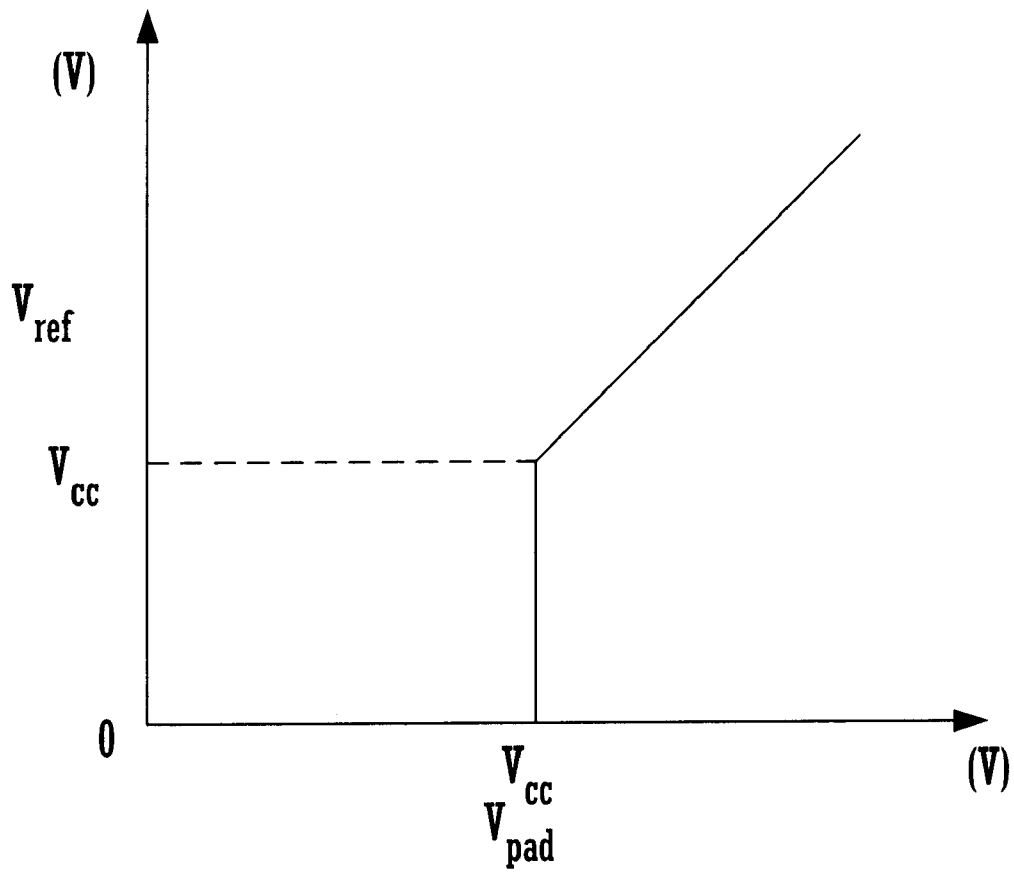
FIG. 6 shows a voltage reference signal used to control the bus hold circuit and output driver of the I/O interface shown on FIG. 4.
Figure 7:
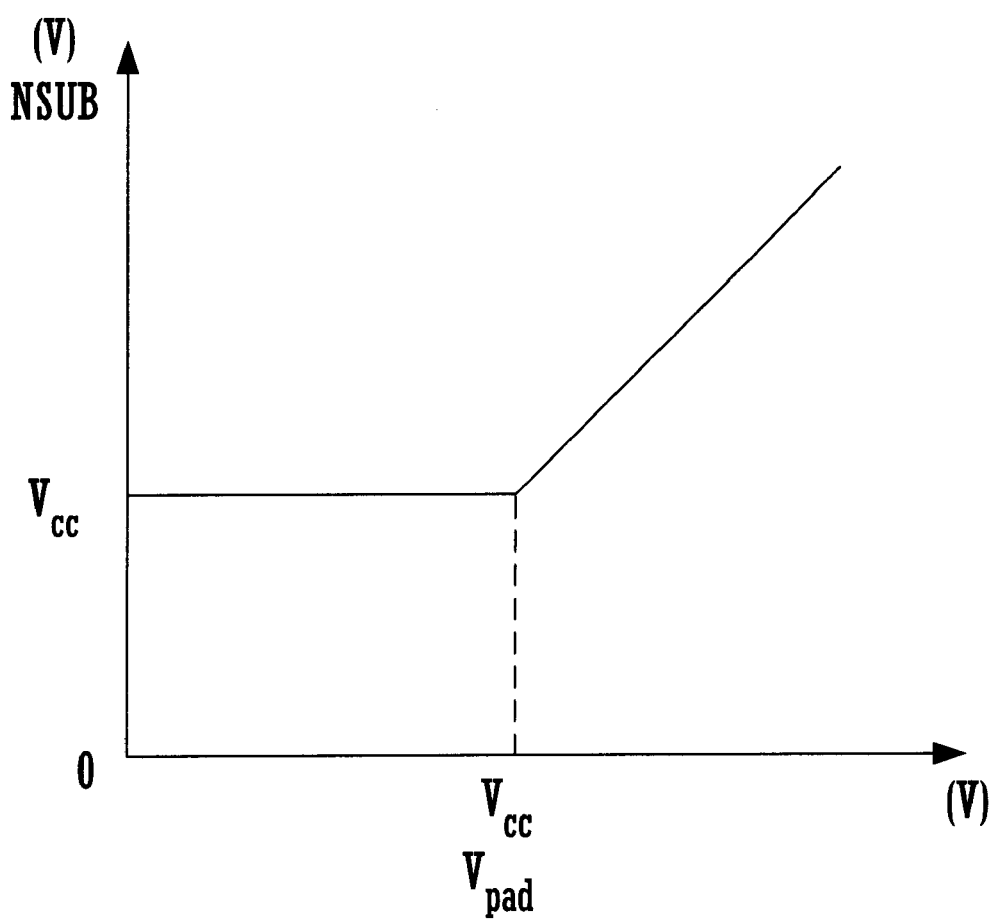
FIG. 7 shows an n-well bias signal used to control the bus hold circuit of FIG. 5 and output driver shown on FIG. 4.
Figure 8:
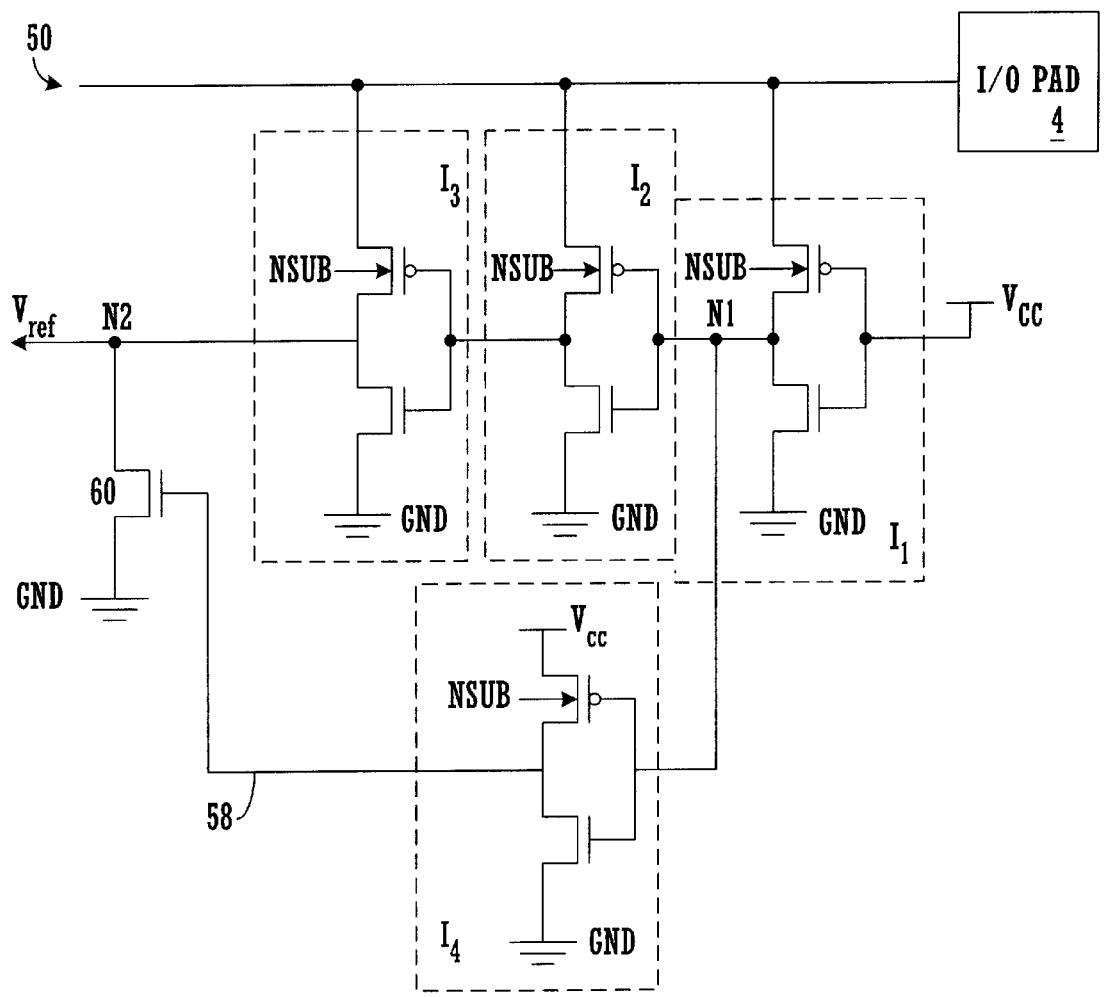
FIG. 8 illustrates a conventional reference voltage generating circuit for generating the reference voltage used in the I/O interface of FIG. 4.
Figure 9:
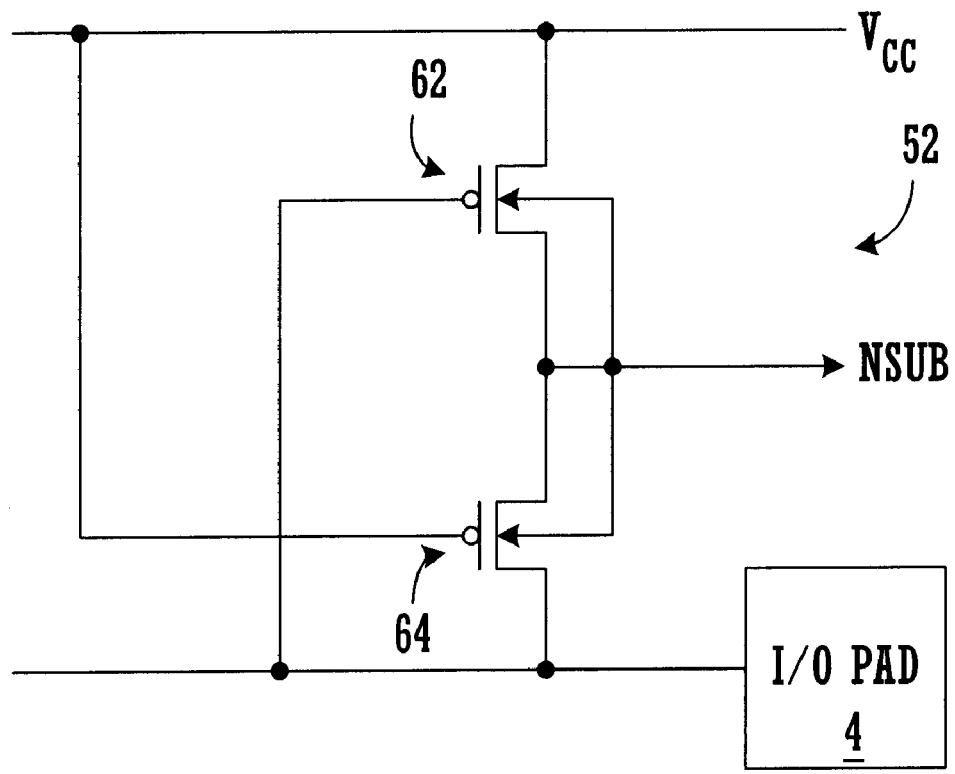
FIG. 9 illustrates a conventional n-well bias signal generating circuit for generating the n-well bias signal used in the I/O interface of FIG. 4.
Figure 10:
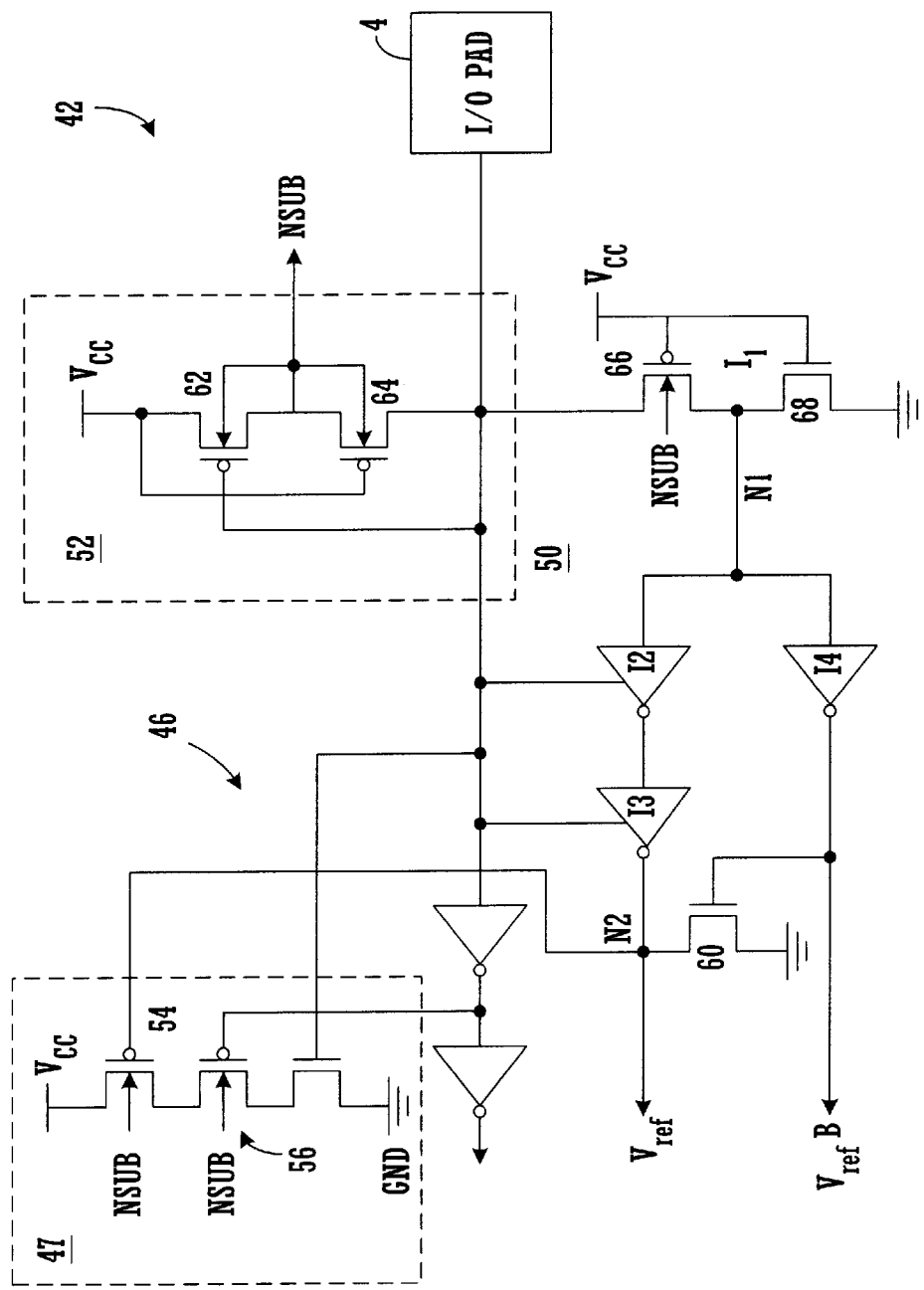
FIG. 10 is a detailed circuit diagram of the conventional overvoltage tolerant I/O interface shown in FIG. 4.
Figure 11:
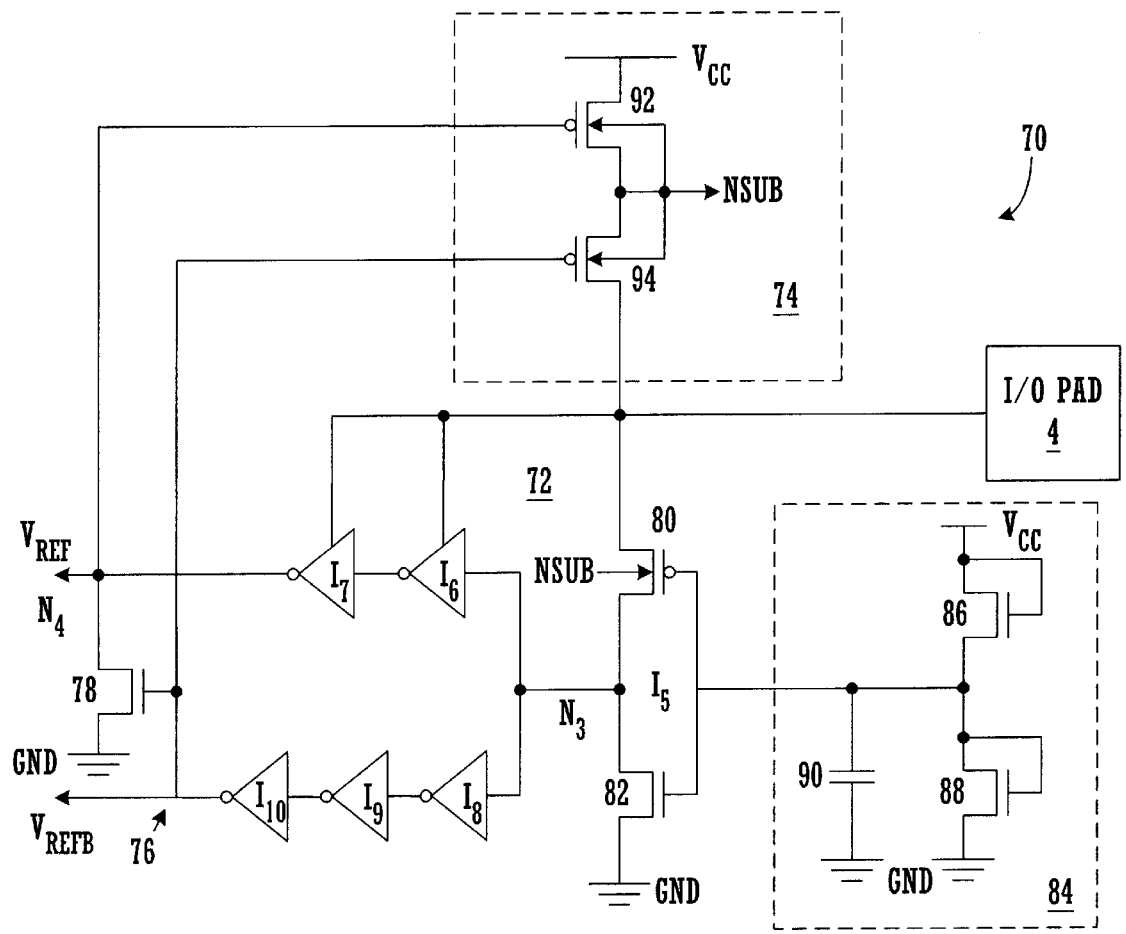
FIG. 11 is a detailed circuit diagram of a reference voltage generating circuit for an I/O interface of an integrated circuit configured in accordance with one embodiment of the present invention.

FIG. 11 illustrates one exemplary embodiment of an overvoltage tolerant I/O interface 70 (e.g., an input/output buffer) for an integrated circuit configured in accordance with the present invention. Details regarding the input buffer and output buffer (which may be conventional in nature) have not been shown so as not to unnecessarily obscure the present invention. Instead, the remaining discussion will focus on reference voltage generating circuit 72 and an n-well bias signal generating circuit 74 which, although similar in some regards to circuits 50 and 52 of FIG. 10, include important distinctions which allow the present invention to provide an overvoltage tolerant interface with a substantially reduced trip point and faster transition response than the circuit of FIG. 10. As a result, the present invention provides a substantially reduced pad current during overvoltage conditions than was the case for the circuit of FIG. 10.

Reference voltage generating circuit 72 and n-well bias signal generating circuit 74 are connected to the I/O pad 4 and control the operation of an input buffer and output buffer (not shown) as discussed above. The signals Vref and NSUB generated by each of these circuits, respectively, are coupled to the gates and n-wells, respectively, of a number of PMOS transistors found within the input buffer and output buffer, to provide an overvoltage tolerant interface suitable for connection to a bus which may operate above the supply voltage (Vcc, e.g., 3.3 volts). Each of these signals is arranged to track whatever voltage appears at I/O pad 4.

In operation, voltage reference signal Vref remains at zero volts, provided the voltage at I/O pad 4 does not exceed the on-chip Vcc. However, if the pad voltage rises above Vcc, the reference voltage signal Vref tracks the pad voltage to control the voltage at the gate of an isolation transistor in the input buffer, as described above. This causes the isolation transistor to switch off, thereby isolating the input buffer from the voltage source Vcc. Accordingly, the input buffer does not source current to Vcc.

In addition, the n-well bias signal NSUB is held constant at a level substantially equal to Vcc, providing the pad voltage is at or below Vcc. If the pad voltage rises above Vcc, the n-well bias signal NSUB then tracks the pad voltage. This ensures that the parasitic n-well diodes in PMOS transistors of a bus hold circuit remain reversed biased, and therefore do not source current to Vcc.

The voltage reference signal Vref and a corresponding signal VrefB are supplied by the voltage reference signal generating circuit 72. This circuit is designed to (1) detect when the voltage at I/O pad 4 exceeds Vcc and, (2) provide the overvoltage input to the input/output buffers. The voltage reference signal generating circuit 72 includes a concatenated series of inverters $I_5$, $I_6$ and $I_7$, which may be substantially similar to inverters $I_1$, $I_2$ and $I_3$ described above, each having a PMOS transistor connected in series with an NMOS transistor. The n-wells of each of these PMOS transistors are driven by the n-well bias signal NSUB, thus ensuring that the parasitic n-well diodes remain reversed biased and therefore do not source current to Vcc. The sources of each of the PMOS transistors of inverters $I_5$, $I_6$ and $I_7$ are connected to I/O pad 4. An output of the first inverter $I_1$ is fed via further inverters $I_8$, $I_9$ and $I_{10}$, in a feed forward circuit path 76 to an NMOS pull-down transistor 78 at the output (Vref) of circuit 72.

Unlike the conventional voltage reference signal generating circuit described above, however, the gates of transistors 80 and 82 in inverter $I_5$ are tied to the output of a voltage divider circuit 84. Voltage divider circuit 84 includes a pair of transistors 86 and 88, coupled in series between Vcc and GND. Optional capacitor 90 is included to reduce any coupling effect. Transistors 86 and 88 are preferably NMOS transistors coupled as diodes.

The output of voltage divider circuit 84 is a voltage approximately equal to Vcc −Vth, where Vth is the threshold voltage of transistor 86. This threshold voltage is kept very small by configuring transistor 86 accordingly. Transistor 88 is a long channel device. By keeping the threshold voltage of transistor 86 very low, the trip point of the voltage reference signal generating circuit 72 may be kept just slightly above Vcc as opposed to Vcc +Vtp, as was the case for the conventional I/O interface described above.

In operation, when the pad voltage is below Vcc, PMOS transistor 80 in inverter $I_5$ turns off, and NMOS transistor 82 turns on. This gives a low output at node $N_3$ which, once inverted by inverters $I_8$, $I_9$ and $I_{10}$, causes NMOS transistor 78 to turn on, pulling the output at node $N_4$ of the circuit 72 (i.e., Vref) low. When the pad voltage rises above Vcc, PMOS transistor 80 in inverter $I_5$ turns on so that the output at node $N_3$ is pulled up to the voltage at I/O pad 4. This voltage is then passed through inverter stages $I_6$ and $I_7$, and appears at node $N_4$ (Vret) at the output of the circuit 72. Accordingly, when the pad voltage rises above Vcc, the reference voltage Vref tracks the pad voltage. The concatenated series of inverters $I_5$, $I_6$ and $I_7$, act as buffers and so improve the edge rate of the Vref signal. PMOS transistor 80 in inverter $I_5$ is significantly larger, and hence more powerful, than NMOS transistor 82. Accordingly, when PMOS transistor 80 turns on, it is able to pull node $N_3$ high, despite the efforts of NMOS transistor 82 to pull the node low. The concatenations of the buffers $I_5$, $I_6$ and $I_7$ is required to decouple the large load capacitance connected on node $N_3$ from the output of inverter $I_5$.

N-well bias signal (NSUB) generating circuit 74 includes a pair of PMOS transistors 92 and 94, connected in series between Vcc and I/O pad 4. Unlike the prior NSUB generating circuit, however, the gate of PMOS transistor 92 is connected to Vref, and not to I/O pad 4, and the gate of PMOS transistor 94 is connected to VrefB and not Vcc. These connections allow for a very fast transition of signal NSUB, when the trip point of voltage reference signal generating circuit is reached. Because the trip point of voltage reference signal generating circuit 72 is lower than was the case for the prior I/O interface discussed above, this means that the signal NSUB will track the pad voltage much more quickly and with a much reduced current spike than was the case for prior I/O interfaces.

Figure 12:
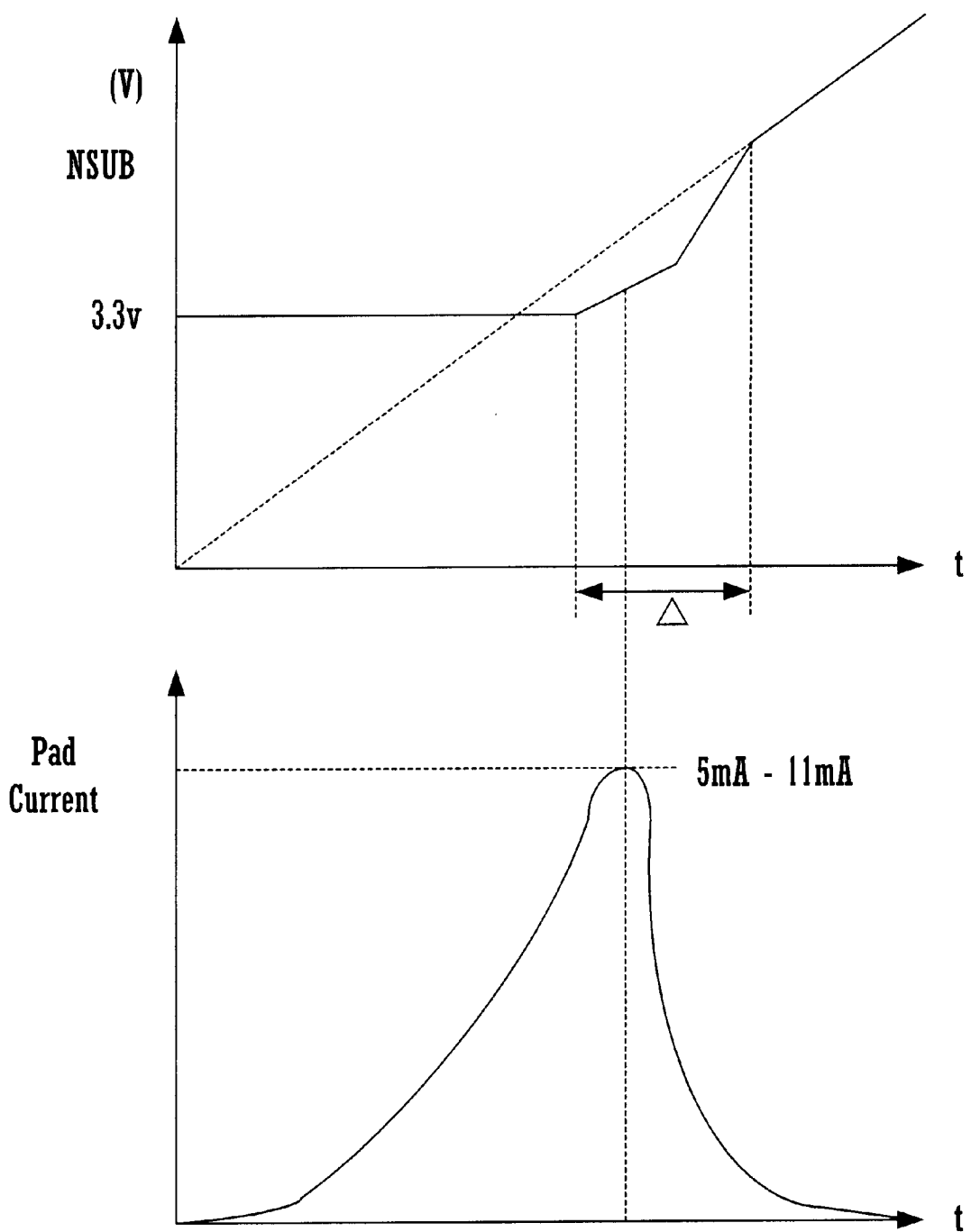
FIG. 12 shows an n-well bias signal used to control the input buffer of a conventional UO interface of an integrated circuit and the corresponding current spike which is experienced at the I/O pad thereof.
Figure 13:
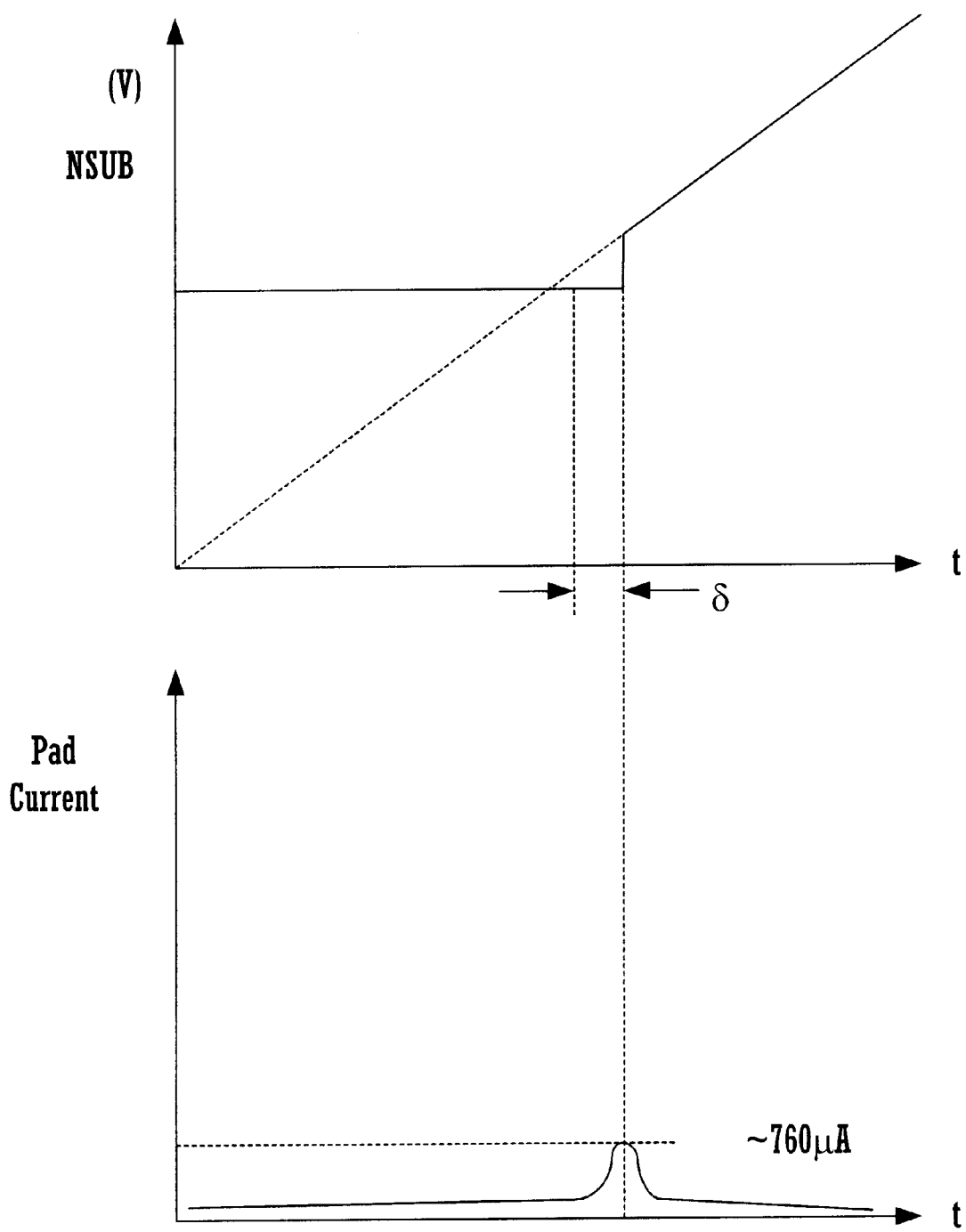
FIG. 13 shows an n-well bias signal used to control the input buffer of an I/O interface of an integrated circuit configured in accordance with the teachings of the present invention and the corresponding current spike which may be experienced at the I/O pad thereof.

For example, as shown in FIG. 12, when the pad voltage is at or below Vcc, the output of prior NSUB circuits was held constant at a level substantially equal to Vcc (e.g., 3.3 volts). When the pad voltage was raised above Vcc, the output NSUB tracked the pad voltage, however, there was a time delay Δ during this transition and, as shown, during this time delay there was a significant pad current (on the order of 5 −11 mA) experienced at I/O pad 4. Now, using an I/O interface configured in accordance with the present invention, when the pad voltage is at or below Vcc, the output of NSUB circuit 74 is still held constant at a level substantially equal to Vcc (e.g., 3.3 volts). However, as shown in FIG. 13, when the pad voltage rises above Vcc, the output NSUB tracks the pad voltage with only a time delay ∂ (much smaller than Δ) and, as shown, during this time delay ∂ there is a significantly lower pad current (on the order of 760 μA) experienced at I/O pad 4.

As before, the NSUB signal may be applied to a number of PMOS transistor components in the I/O interface 70, to bias the n-wells thereof. This keeps the parasitic diodes of the n-wells reversed biased so there is no current sourced to Vcc. A single, global voltage divider circuit 84 may be used for all the I/O interface circuits 70 of an IC, thereby saving on layout space.

Figure 14:
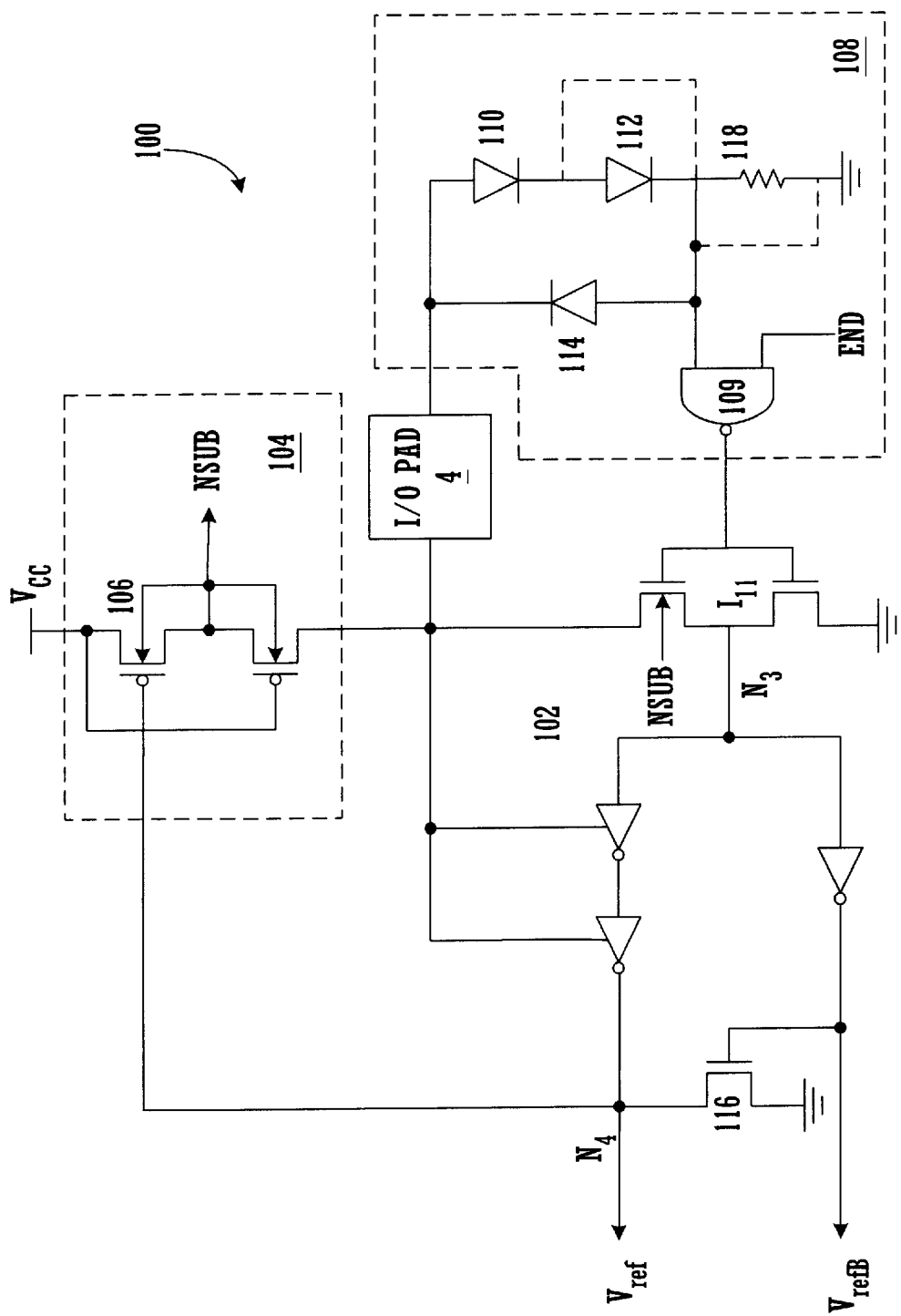
FIG. 14 is a detailed circuit diagram of a reference voltage generating circuit for an I/O interface of an integrated circuit configured in accordance with an alternative embodiment of the present invention.

FIG. 14 illustrates an alternative, exemplary embodiment of an overvoltage tolerant I/O interface 100 (e.g., an input/output buffer) for an integrated circuit configured in accordance with the present invention. Again, details regarding the input buffer and output buffer (which may be conventional in nature) have not been shown so as not to unnecessarily obscure the present invention. In this embodiment, reference voltage generating circuit 102 is substantially similar to circuit 50 of FIG. 10. N-well bias signal generating circuit 104 is similar to circuit 52 of FIG. 10, with the exception that the gate of PMOS transistor 106 is coupled to Vref and not I/O pad 4, thus allowing the signal NSUB to track the pad voltage much more quickly and with a much reduced current spike than was the case for prior I/O interfaces. The signals Vref and NSUB generated by each of these circuits, respectively, are coupled to the gates and n-wells, respectively, of a number of PMOS transistors found within an input buffer and output buffer, to provide an overvoltage tolerant interface suitable for connection to a bus which may operate above the supply voltage (Vcc, e.g., 3.3 volts). Each of these signals is arranged to track whatever voltage appears at I/O pad 4.

The operation of circuits 102 and 104 is substantially similar to that of circuits 72 and 74 of FIG. 11 and need not be discussed in detail. Briefly, voltage reference signal Vref remains at zero volts, provided the voltage at I/O pad 4 does not exceed Vcc. However, if the pad voltage rises above Vcc, the reference voltage signal Vref tracks the pad voltage to control the voltage at the gate of an isolation transistor in the input buffer, as described above. This causes the isolation transistor to switch off, thereby isolating the input buffer from the voltage source Vcc. Accordingly, the input buffer does not source current to Vcc.

In addition, the n-well bias signal NSUB is held constant at a level substantially equal to Vcc, providing the pad voltage is at or below Vcc. If the pad voltage rises above Vcc, the n-well bias signal NSUB then tracks the pad voltage. This ensures that the parasitic n-well diodes in PMOS transistors of a bus hold circuit remain reversed biased, and therefore do not source current to Vcc.

In this embodiment, the gates of the transistors of inverter $I_{11}$ are tied to the output of voltage divider circuit 108. Voltage divider circuit 108 includes NAND gate 109 having an output coupled to inverter $I_9$ and an input coupled to receive a voltage which is approximately equal to the pad voltage (Vpad) less a threshold voltage VD (or optionally 2VD) of diode 110 (or optionally diodes 110 and 112) (i.e., Vpad−VD or Vpad−$2V_D$). Thus, the trip point of voltage divider circuit 108 will be Vpad−VD, or Vpad−$2V_D$, as appropriate. Signal enb is an enable signal and may be held at a logic high when the I/O interface 100 is in operation. Diode 114 and optional leaker resistor 118 provides a discharge path when the pad voltage is a logic 0.

Thus, when the pad voltage is below Vcc, the PMOS transistor in inverter $I_9$ turns off, and the corresponding NMOS transistor urns on. This gives a low output at node $N_3$ which causes NMOS transistor 116 to turn on, pulling the output at node $N_4$ (i.e., Vref) low. This will cause NSUB to be approximately equal to Vcc.

When the pad voltage rises above Vcc, the PMOS transistor in inverter $I_9$ turns on so that the output at node $N_3$ is pulled up to the voltage at I/O pad 4. This voltage appears at node $N_4$ (Vref), and the reference voltage Vref tracks the pad voltage. Under such conditions signal NSUB tracks the pad voltage, and does so much more quickly and with a much reduced current spike (indeed perhaps no current spike) than was the case for prior I/O interfaces.

Thus, an overvoltage tolerant I/O interface for an integrated circuit has been described. Although discussed with reference to certain exemplary embodiments, however, the present invention should not be limited thereby. Instead, the present invention should only be measured in terms of the claims which follow.

What is claimed is:

1. An overvoltage tolerant input/output (I/O) interface for an integrated circuit comprising an overvoltage detection circuit configured to have a trip point at a first voltage provided by a voltage divider circuit;

wherein the voltage divider circuit comprises a pair of transistors coupled in series between a voltage source having a second voltage and ground;

wherein the first voltage is approximately equal to the difference between the second voltage and a threshold voltage of one of the pair of transistors; and wherein the threshold voltage of the one of the pair of transistors is small enough that the trip point is essentially equal to the second voltage.

2. A method comprising generating an n-well bias signal of an overvoltage tolerant input/output (I/O) interface of an integrated circuit according to a first voltage produced by a voltage divider circuit;

wherein the voltage divider circuit comprises a pair of transistors coupled in series between a voltage source having a second voltage and ground;

wherein the first voltage is approximately equal to the difference between the second voltage and a threshold voltage of one of the pair of transistors; and wherein the threshold voltage of the one of the pair of transistors is small enough that the n-well bias signal is essentially equal to the second voltage.

3. The method of claim 2 wherein the n-well bias signal is held constant so long as a pad voltage at the I/O interface remains at or below an operating voltage of the integrated circuit and otherwise tracks the pad voltage.

4. A method comprising generating a reference voltage signal for an overvoltage tolerant input/output (I/O) interface of an integrated circuit according to a first voltage produced by a voltage divider circuit;

wherein the voltage divider circuit comprises a NAND gate having an output coupled to the overvoltage detection circuit and an input coupled to receive a second voltage; and wherein the second voltage is determined by a voltage at an I/O pad of the I/O interface and a voltage at one or more diodes coupled between the I/O pad and the NAND gate.

5. The method of claim 4 wherein an n-well bias signal of the integrated circuit is held constant so long as a pad voltage at the I/O interface remains at or below an operating voltage of the integrated circuit and otherwise tracks the pad voltage.

6. The method of claim 5 wherein the reference voltage of the integrated circuit is held constant so long as the pad voltage at the I/O interface remains at or below the operating voltage of the integrated circuit and otherwise tracks the pad voltage.

7. An overvoltage tolerant input/output (I/O) interface for an integrated circuit comprising an overvoltage detection circuit configured to have a trip point at a first voltage provided by a voltage divider circuit;

wherein the voltage divider circuit comprises a logic gate having an output coupled to the overvoltage detection circuit and an input coupled to receive a second voltage, wherein the logic gate is selected from the group consisting of an AND gate, an OR gate, a NAND gate, and a NOR gate; and wherein the second voltage is determined by a voltage at an I/O pad of the I/O interface and one or more diodes coupled between the I/O pad and the logic gate.

* * * * *